United States Patent [19]
Lasky et al.

[11] Patent Number: 5,631,987
[45] Date of Patent: May 20, 1997

[54] LOW COST, MODE-FIELD MATCHED, HIGH PERFORMANCE LASER TRANSMITTER OPTICAL SUBASSEMBLY

[75] Inventors: Ronald C. Lasky, Endwell; Sylvester Johnson, IV, Brooktondale, both of N.Y.

[73] Assignee: Reliaspeed, Inc., Brooktondale, N.Y.

[21] Appl. No.: 475,635

[22] Filed: Jun. 7, 1995

[51] Int. Cl.$^6$ ..................... G02B 6/36
[52] U.S. Cl. ............... 385/88; 385/90; 385/92
[58] Field of Search ................ 385/88–94, 43

[56] References Cited

U.S. PATENT DOCUMENTS

| | | | |
|---|---|---|---|
| 4,241,978 | 12/1980 | Dubois et al. | 385/88 X |
| 4,877,300 | 10/1989 | Newhouse et al. | 385/43 |
| 4,927,228 | 5/1990 | Van De Pas | 385/90 |
| 5,499,312 | 3/1996 | Hahn et al. | 385/88 |

OTHER PUBLICATIONS

Betzig, et al, Near–field Scanning Optical Microscopy, (1988) Scanning Microscopy Technologies and Applications, Proceedings of the SPIE vol. 897, pp. 91–98.

McGroarty et al, Statistics of Solder Joing Alignment for Optoelectronic Components, IEEE CHMT 16 (1993), pp. 527–529.

Edge et al, Robust Interfacing of Integrated Optics With Optical Fibres Using a Self–Aligning Technique, Proceedings of the SPIE, 1989 (No Month) vol. 1177, pp. 374–378.

Collins, J.V. et al, Passive Alignment of a Tapered Laser With More Than 50% Coupling Efficiency, Electronics Letters, vol. 31, No. 9, Apr., 1995, pp. 730–731.

Lealman, I.F. et al, InGaAsP/InP tapered active layer multiquantum well laser with 1.8 dB coupling loss to cleaved singlemode fibre, Electronics Letters, vol. 30, Sep. 1994, No. 20, pp. 1685–1687.

Houghton, A.J.N. et al, Design Manufacture and Performance of Receptacle (Connectorised) Laser Diode Packages for 1.3 um and 1.55 um Fibre Systems, 1992, Northern Telecom Optoelectronics, pp. 624–629.

*Primary Examiner*—Phan T. H. Palmer
*Attorney, Agent, or Firm*—Barnard, Brown & Michaels

[57] ABSTRACT

A new type of transmitter optical subassembly (TOSA) especially suitable for fiber optic communication. The TOSA has a light source such as a laser diode, preferably of the surface-emitting type, with an inherent mode-field diameter matched without a lens to that of the optical fiber, resulting in enhanced light coupling, more relaxed tolerances, and less sensitivity to laser misalignment. The TOSA can be in a receptacle form, with an annulus having a light conductor matched to the light source and the fiber, or can be in "pigtail" form with a permanently attached buffered optical fiber. Only one active alignment is required, and can be eliminated, if the laser diode is aligned passively using lands on the annulus or the end of the fiber cladding, and matching lands on a mounting substrate, with molten solder alignment used to draw the two into alignment. To reduce reflections back into the laser the laser sides of the annulus and the light conductor can be machined at an angle with respect to the optic axis, or the diode can be placed at an angle relative to the fiber. This design not only reduces back reflections into the laser diode, but the reflected light can be used to monitor and control the laser diode output.

32 Claims, 6 Drawing Sheets

LOW COST, MODE-FIELD MATCHED, HIGH PERFORMANCE LASER TRANSMITTER OPTICAL SUBASSEMBLY

FIELD OF THE INVENTION

The invention pertains to the field of laser diodes packaged in optical sub-assemblies. More particularly, the invention pertains to packaging for laser diodes used in fiber-optic communication systems.

BACKGROUND OF THE INVENTION

Fiber optic communications are a technology area that is of crucial importance to U.S. High Technology industries. The 1990 Council on Competitiveness identified fiber optics as one of the key technology areas where U.S. industry is competitive in the world marketplace.

At present, the telecommunications industry is the largest user and developer of fiber optic products. However, the data communications industry is beginning to convert to fiber, and it is in data communications that the most growth potential is expected over the next 20 years. It is also expected that this growth will also be fueled by the emergence of ATM/SONET as a convergence of telecommunications and data communications (Ref. 5).

The optoelectronic telecommunications (opto telecom) industry developed the fundamental technologies to facilitate the emergence of the optoelectronic data communications (opto datacom) industry. There are, however, considerably different user requirements in these two industries that have driven the opto datacom product developers to expand on the telecom base technologies.

One of the most significant differences is that opto datacom is transceiver module and connector intensive, while opto telecom is cable length intensive. Currently, opto datacom is emerging more slowly than expected due to cost resistance for transceiver modules and connectors. Recently, the cost of opto datacom cables with duplex connectors has dropped below $100 with the introduction of the SC Duplex connector. We expect that current efforts by cable vendors will continue this cost reduction to the $50 range, especially with the recent introduction of plastic ferrules.

The transceiver module is another story. Projected costs are much too high to allow proliferation of this technology. Discussions that we have had with several optoelectronic suppliers indicate that a price of $150 per Gbit/s for a transceiver module will be needed for wide application of opto datacom and eventually fiber to the home. Currently, these modules are in the $600–800 range and economies of scale can only reduce this price range to $500–600.

Currently, the most expensive element in transceiver modules, typically approximately 60%, is the optical sub-assembly (OSA). The OSAs contain the optical transmitting and receiving devices and a lens to focus the light. Typically, there will be two—the Transmitting OSA (TOSA) and Receiving OSA (ROSA).

Of the two OSAs, the one that transmits light (TOSA) represents about 75% of the cost of the two OSAs, as the aligning of the light from the laser source is much more difficult than focusing the light from the fiber onto the receiver photo diode.

The current technology starts with an edge emitting laser and usually envelops it in two levels of packaging, requiring three separate and painstaking alignment steps.

In the first level of packaging the optical source is first packaged into a "TO" (transistor outline) can. The optical source is usually a semiconductor laser, but could be an LED. The resulting TO package has a block on which the source is mounted, and conductive leads to make the electrical connections. The TO package is hermetically sealed, with a glass window to let the light out. The alignment of the source is active and semi-precise.

The TO can is then aligned to a "selfoc®" or "GRIN" lens in a second active alignment. The lens is needed because the laser spot size (mode-field diameter) is on the order of 1 micron, and very divergent. Without this lens the coupling of light into the optical fiber in the connector would be less than 5% efficient.

The lens and TO can combination is then actively aligned to the remainder of the TOSA body. The manufacturing process to produce the current TOSA design is highly labor intensive because of the three active alignments required.

Many of the parts in the connector are expensive machined stainless steel or ceramic. A concerted effort in reducing the levels of packaging and developing significantly less expensive opto packaging designs, materials and processes would competitively posture the U.S. to be in a leadership position in this important technology.

SUMMARY OF THE INVENTION

This invention is for a new type of laser transmitter optical subassembly (TOSA) especially suitable for fiber optic communication. It uses a laser diode as a light source having an inherent mode-field diameter matched to that of a optical fiber without the aid of lenses or other adaptations, combined with several unique packaging features that allow low cost and high performance when compared to current technology. The mode-field matching also makes this design much less sensitive to laser misalignment.

In its embodiment as a receptacle TOSA for accepting mating optical fiber plugs, the low cost, high performance TOSA design of the invention preferably uses a high precision bore to mate to the receiving connector. An annulus in the bore has a light conductor with a mode-field diameter related to that of the optical fiber in the cable—preferably identical to it. This light conductor in the annulus is preferably a stub extending through the annulus, but in some applications it could even be the communication cable fiber itself or a tube with a reflective interior.

In addition to the plug/socket embodiment, a TOSA which may be used in a form directly connected to the fiber of the cable itself or to a short section of buffered fiber (i.e. a "pigtail") is disclosed.

Since no lens is used, there is only one low tolerance active alignment versus three alignments required for the conventional design. The tolerances for low cost manufacturing are even further relaxed by use of a spacer to reduce or eliminate adjustment requirements in the vertical (Z-axis) direction.

To reduce reflections back into the laser the end of the light conductor in the annulus can be machined at an angle with respect to the optic axis, or, at a loss in coupling efficiency, the light source can be mounted at an angle to the light fiber. This design not only reduces back reflections into the laser, but the reflected light off the light conductor or the bottom side of the annulus can be used to monitor and control the laser output. Alternatively, in place of angling either conductor or source, an index of refraction matching material can be inserted between the light conductor and the light source.

DETAILED DESCRIPTION OF THE DRAWINGS

Figure 1:
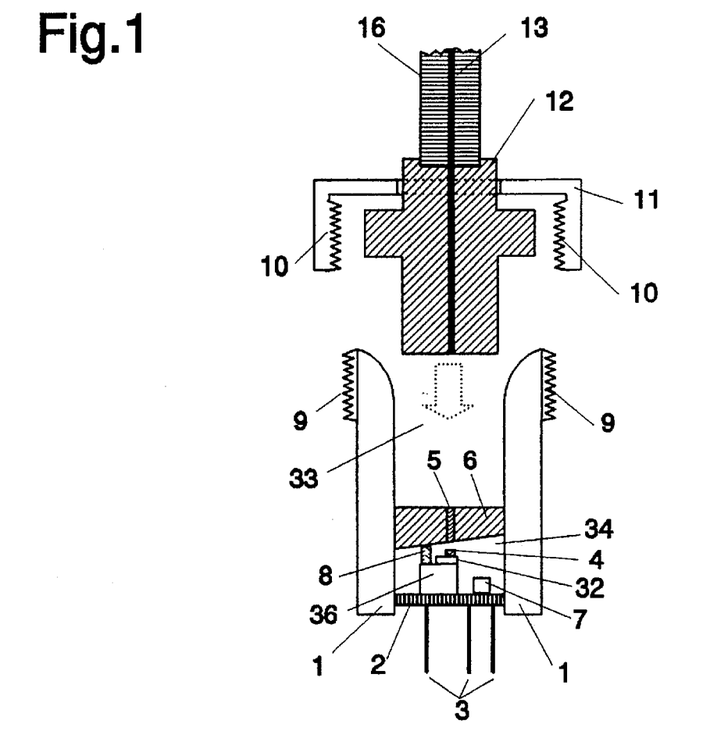
FIG. 1 shows a side cut-away view of the TOSA of the invention.

FIG. 1 shows a TOSA built according to the teachings of the invention, in its preferred embodiment as a socket for mating with a plug (12) for a communications cable (16) having an optical fiber (13), preferably of the single-mode type, with its threaded locking ring (10).

Figure 9:
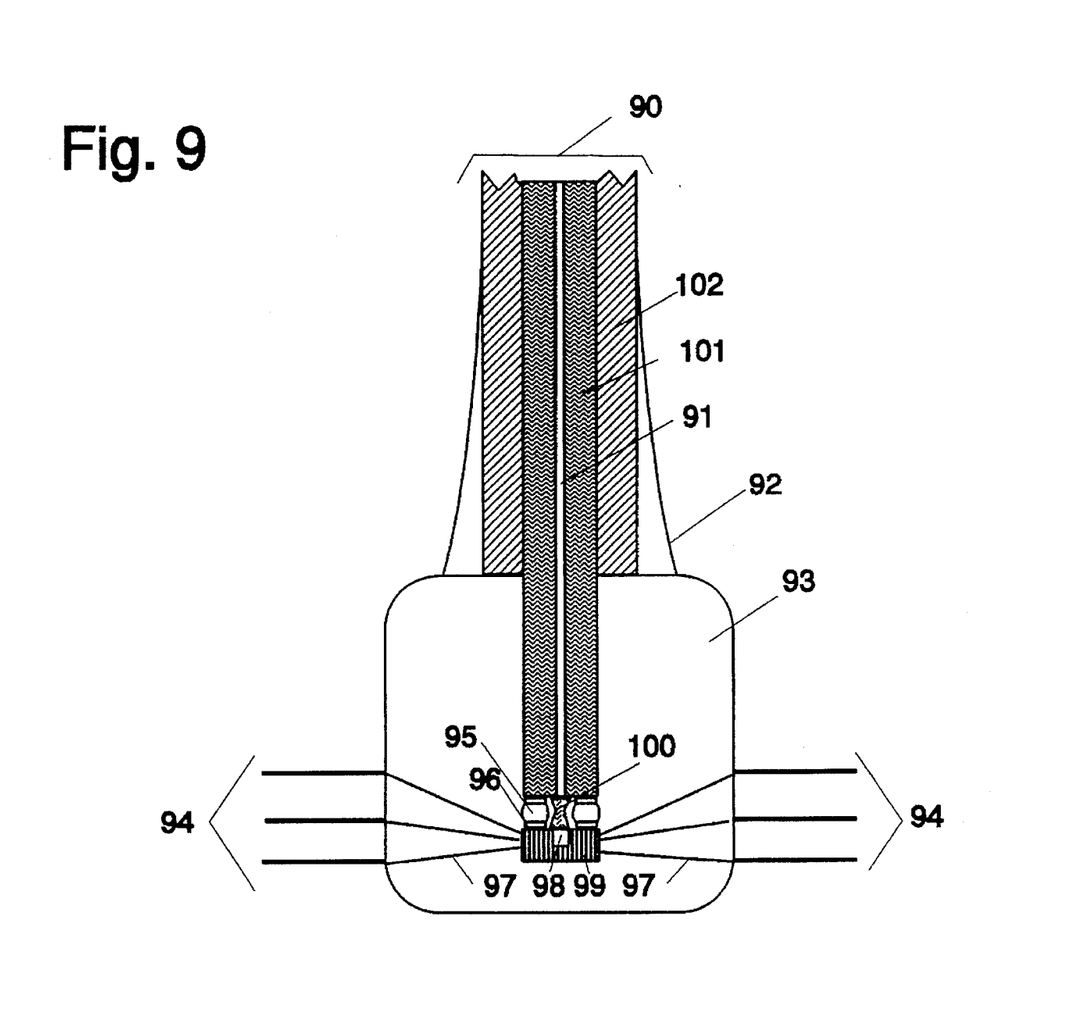
FIG. 9 shows a variation on the embodiment of FIG. 8.

Most fiber optic cables today have a four-layer construction as shown in detail in FIG. 9, in which an optical fiber comprising a central glass fiber core (91) covered with a glass cladding layer (101), with the optical fiber being covered by a plastic buffer layer (102), finally covered with a protective sheath (not shown for the buffered cable pigtail used in FIG. 9, but would be present in actual cables). For simplicity, however, the drawings (other than FIG. 9) will show the optical fiber as a single conductor, without specifically showing the cladding layer and the coating as a single layer separate buffer and sheath layers.

The TOSA preferably uses a vertical cavity, surface emitting laser (VCSEL) diode(4) as a light source, mounted on a substrate (32). It is advantageous that the type of laser diode chosen have the property that its inherent mode-field diameter can be selected during fabrication. Other laser diodes can be used within the teachings of the invention, however, with other types of surface-emitting laser diodes being preferred. Although not preferred, other types of light-emitting diodes (LEDs) could also be used for light sources within the teachings of the invention.

It should be noted that the term "mode-field diameter" is used in the context of the diode and single-mode optical fibers, rather than simply "diameter" because, as recognized in Maxwell's equations, the light-carrying diameter is not the same as the geometric diameter. It is affected by the indices of refraction of the different materials. The mode-field diameter of the optical fiber in the fiber optic cable is specified by the cable manufacturer. For example, Corning model SMF-28 fiber has a nominal mode-field diameter of 9 microns.

The term "inherent mode-field diameter" of the light source is used in this specification to mean the mode-field diameter of the light source itself, without modification or adaptation by lenses or other means external to the light source.

Figure 11:
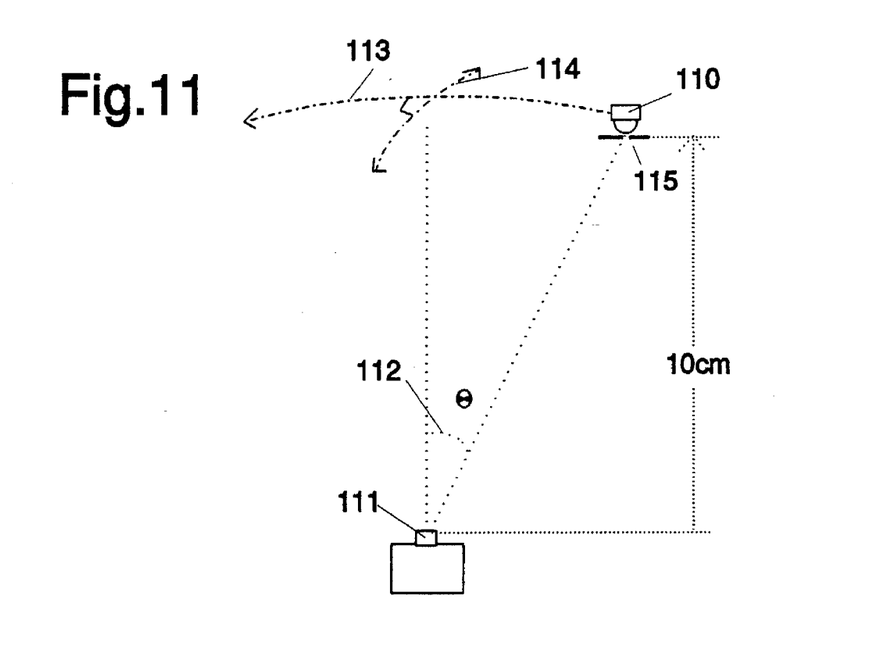
FIG. 11 shows the setup used to measure the mode-field diameter of a laser diode.

The inherent mode-field diameter of a light source such as a laser diode is determined by measurement, as shown in FIG. 11. A photodiode (110) is placed approximately 10 cm from the laser diode (111). A slit (115) is placed in front of the photodiode to increase accuracy of scan. As it is scanned across the beam along a track (113) (the track being curved so that the photodiode remains about 10 cm from the laser), the angle θ (112) from the optical axis of the laser and the optical power at the photodiode is measured. The mode-field diameter is calculated by numeric integration, according to the following formulae:

$$MFD = 2W,$$

where $$2W = \frac{\sqrt{2}}{\pi} \left[ \frac{\int_0^\infty q F^2(q) dq}{\int_0^\infty q^3 F^2(q) dq} \right]^{\frac{1}{2}}$$

where:

$$q = \frac{1}{\lambda} \sin\theta$$

and

λ is the wavelength of the light $F^2(q)$ is the power measured by the photodiode For greater accuracy, a second scan along a line (114) orthogonal to the first scan (114) could be performed.

If the inherent mode-field diameter of the laser is close to that of the optical fiber, no lens is needed, since the coupling of light into a fiber is greatest when mode-field diameters are matched. For example, the mode-field diameter of a conventional edge emitting laser is 1–2 micron, resulting in only 2% coupling into an optical fiber with a 10 micron mode field diameter. Therefore, a lens would be used in a conventional TOSA to increase the effective mode-field diameter, and thus to increase coupling.

However, if one can select the inherent mode-field diameter of the light source (as one can with a VCSEL diode), a laser diode with a 10 micron mode field diameter can be used, which can result in greater than 90% coupling efficiency. Preferably the inherent mode-field diameter of the laser diode will be closely "matched" to the fiber. It should be noted that the use of the term "matched" contemplates not just applications where the mode field diameters are exactly equal, but are preferably within a tolerance of less than ±20%. A greater mismatch could be tolerated, if required by manufacturing processes, with a corresponding reduction in efficiency.

To channel the light into the receiving fiber (13) a light conductor extending through an annulus (6) is used. In FIG. 1, the light conductor is shown as the preferred optical fiber stub (5). Other possible light conductor embodiments are discussed below. The annulus is fixed inside the hollow center of the bore (1) of the TOSA assembly, which is accurately sized to snugly accept the plug (12) and receiving fiber (13) from the fiber optic cable. The bore will be preferably made of a ceramic material, because it can be machined to a precision required by many applications. Other materials, such as metal or plastic, could be used, however.

In addition to the light channeling function this combination also provides a mechanical stop for the plug (12) and receiving fiber (13). Once the plug (12) is inserted into the bore (33) and bottomed against the annulus, it can be locked into place by tightening a locking ring (10) against the threads (9) on the TOSA. The use of a fiber stub (5) also allows for more consistent coupling of light and lessens the concern for laser safety power violations.

Figure 4:
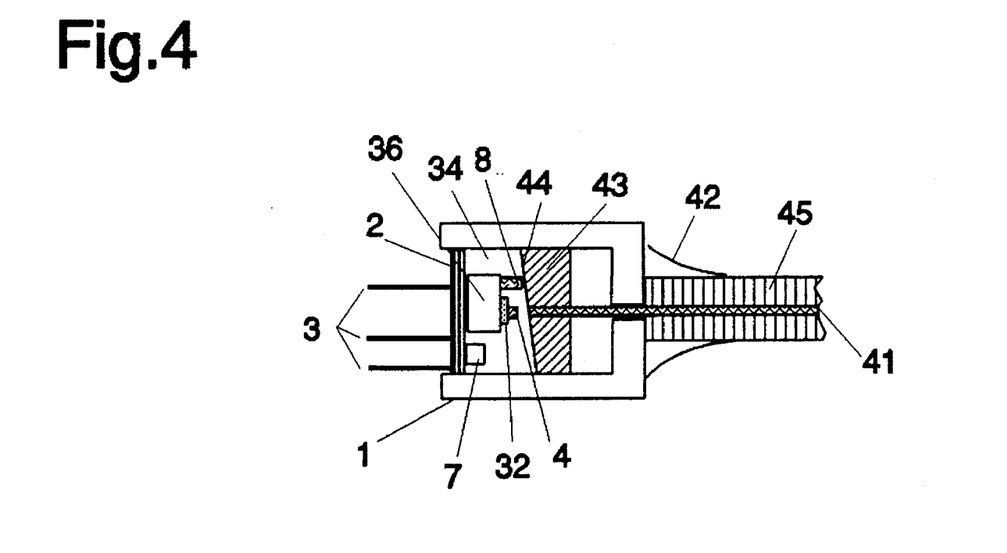
FIG. 4 shows a side cut-away view of an embodiment of the TOSA in which the optical fiber in the annulus is a short fiber "pigtail".

It should be noted at this point that some specialized applications might call for a TOSA which is actually part of or permanently affixed to the end of the communications cable, or to a short section of optical fiber (a "pigtail"), as opposed to the preferred embodiment "receptacle" or plug-and-socket arrangement described in detail here and shown in FIG. 1. Such an alternate arrangement is shown in FIG. 4. The TOSA is essentially the same as the preferred embodiment, except that instead of FIG. 1's fiber stub (5) in the annulus (6), the optical fiber (41) itself extends through the annulus (43), forming the light conductor. The end of the optical fiber (41) is machined at an angle to match the lower side (44) of the annulus (43), as indicated and discussed in the description of the preferred embodiment plug-and-socket arrangement. Because of the fragility of the pigtail (fiber (41) and buffer (45)), strain relief (42) will need to be provided to prevent breakage at the entry to the connector body (1).

Figure 5:
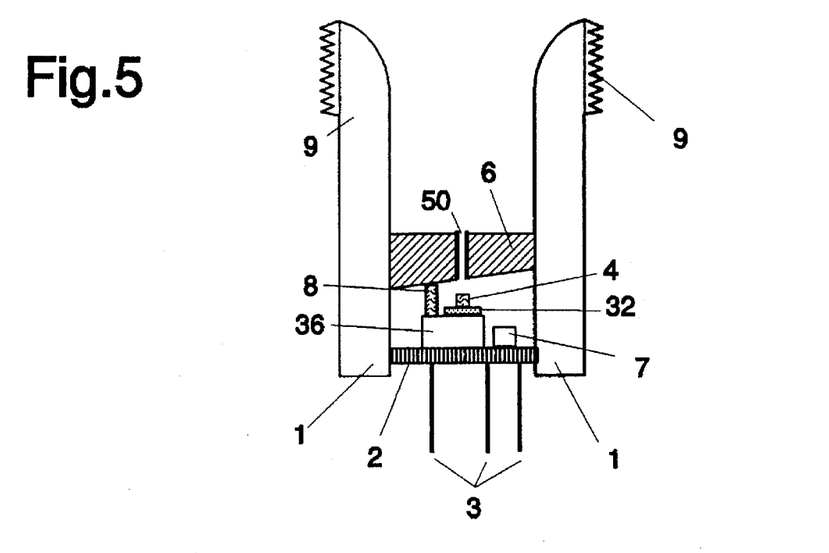
FIG. 5 shows a side cut-away detail of the TOSA in an embodiment using a hollow tube as a light conductor

FIG. 5 shows still another variation (although not the preferred embodiment) on the light conductor in the annulus. In place of the fiber stub (5) of FIG. 1, this TOSA uses a tube (50) which has a reflective inner surface as a light conductor. The tube in this figure is shown as being hollow, but could be filled with some sort of transparent material such as a plastic. This use of a tube as a light conductor was discussed by Betzig, et. al in an article entitled "Near-field Scanning Optical Microscopy", *Scanning Microscopy Techniques, Proceedings of the SPIE Vol.* 897, pp.91–98

Since a lens is not required and the mode-field matching makes alignment tolerances more relaxed, it is possible within the teachings of the invention to reduce the alignment requirement to a single two dimensional (X-Y) process. To achieve this simplification, a spacer (8) between the mounting block (36) and annulus (6) is used to provide alignment in the vertical (Z) direction.

All semiconductor lasers are sensitive to emitted light which becomes reflected back into the laser. These reflections can be caused by the change in index of refraction between the light conductor and the air (or gas) between the light conductor and the laser diode, and by reflections from the bottom of the annulus or fiber optic cable. Reflection induced intensity noise (RIIN) and other problems can be minimized in the design of the invention if the light from the light source is slightly slanted relative to the reflective bottom of the optical fiber and/or annulus.

Figure 2:
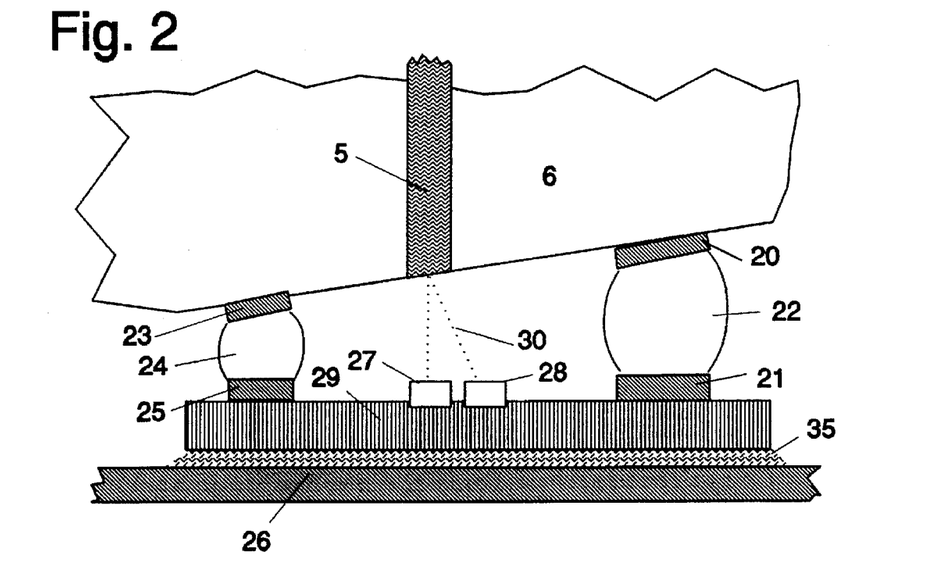
FIG. 2 shows a side cut-away detail of the TOSA showing the method of passive alignment of the laser diode.
Figure 6:
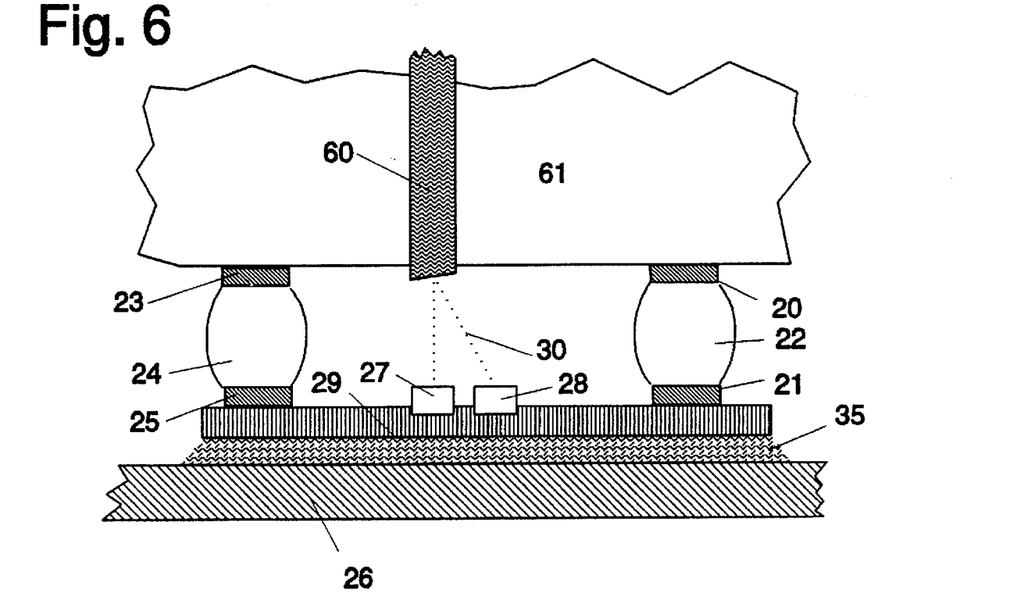
FIG. 6 shows a side cut-away detail of the TOSA in an alternate embodiment to the arrangement of FIG. 3.

A preferred way to incorporate this slant is shown in FIGS. 1 and 2, in which the bottom of at least the light conductor (5) and, preferably, the annulus (6) as well, is angled away from the optic axis of the light source and conductor by less than 10 degrees, preferably by about 7 to 8 degrees. FIG. 6 shows another alternate arrangement where only the end of the light conductor (60) is angled, and the annulus (61) is not.

Figure 10:
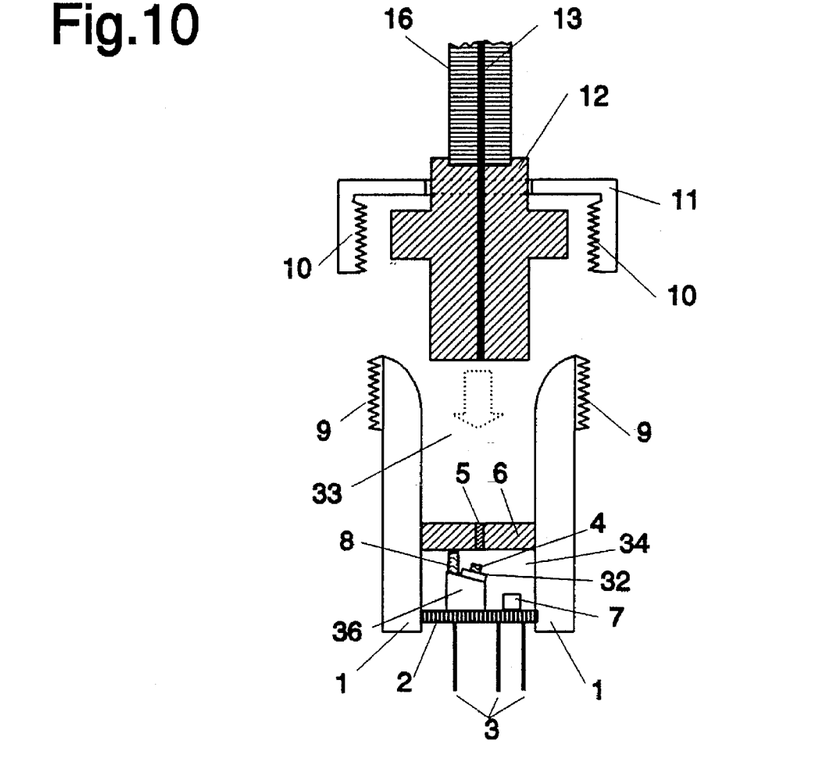
FIG. 10 shows the same view as FIG. 1, with the beam axis of the light source angled.

An alternative method, with some degradation in coupling due to beam misalignment, but at a lower manufacturing cost, is shown in FIG. 10: the top surface of the mounting block (36) is formed with a slight (less than 10°) slant, thereby angling the optical axis of the laser diode (4) mounted on its substrate (32). This design would be used with lower cost, low performance applications, since the angling of the optical axis of the light source does reduce reflections, but also significantly reduces coupling efficiency—perhaps more than one order of magnitude. The actual angle chosen would have to be a balance between RIIN minimization and coupling efficiency.

In conventional TOSA designs the monitor diode measures light off the back facet of an edge emitting laser. The angling of the light source or annulus/conductor surface of the invention also allows this monitoring technique to be used with surface mount lasers and other light sources. Some of the light reflected from the laser (4) reflects off the angled fiber (5) and annulus (6), into a monitor photo diode (7). This monitor diode (7) is used to control the output of the laser. The monitor diode (7) may, if desired, be mounted on the same substrate (32) as the laser diode (4), or the photodetector and laser diode can be monolithically integrated on one die during manufacture. Positive-Intrinsic-Negative (PIN) photodiodes are preferred for this application.

If desired (although this is not preferred), this same arrangement of diode and monitor could be used without the angling of the fiber, if the mode field diameter of the laser diode were made slightly larger so that some light reflects off the bottom of the annulus. This would result in a loss of coupling efficiency due to the deliberate mismatch of mode field diameters.

The annulus and bore can be keyed or otherwise shaped to facilitate rotational alignment of the annulus within the bore. This might be necessary in order to allow the slanted light conductor or annulus to correctly reflect the light to the photodiode. If a hollow tube is used with the matched laser diode, it might be necessary to add a partially reflective surface across the bottom of the tube to reflect some light to the monitor diode.

Figure 7:
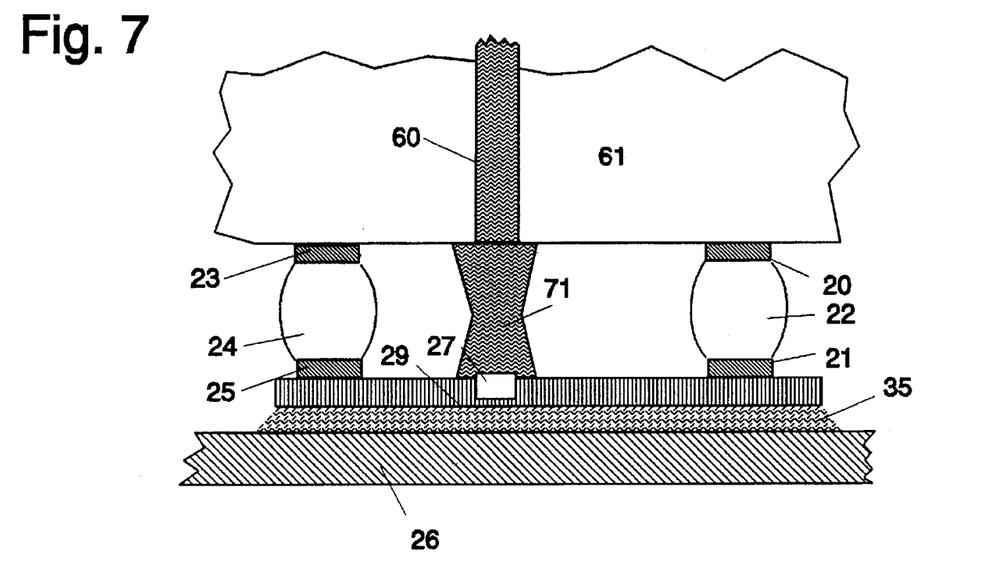
FIG. 7 shows a modification of the embodiment of FIG. 6, in which the substrate is not at an angle, and an index of refraction matching material is provided.

The problem of reflected light can also be minimized without the need for any angling of diode or fiber, as shown in FIG. 7. In this case, the space between the diode (27) and the fiber (60) is filled with an index of refraction matching material (71). This material should be deformable when the TOSA is assembled, but could harden to a solid afterwards, if a hardening substance having appropriate index of refraction characteristics is used. The preferred index of refraction material would be Polymethyl methacrylate (PMMA). This material is particularly good as it can be dissolved in toluene and deposited between the laser diode and fiber after passive alignment. It will dry out to a solid form. Alternatively, a deformable sheet or ball of the material could be placed between the fiber and VCSEL before passive alignment. The collapsing of the solder balls would lock it in place.

Alternately, a fluid such as the kind of oil which is used in oil-immersion microscope lenses could be used as an index of refraction matching fluid. Although it will remain liquid, surface tension in the very small gap (approximately 200 micron or less) between diode and fiber will keep the oil in place.

If active alignment is used, the substrate (32) on which the laser diode (4) (and, possibly, monitor diode (7)) is formed is preferably mounted upon a heat conductive block (36), which acts as a mounting means and heatsink. A heat-conductive material such as copper wool or a thermal grease is used to conduct heat from the substrate (32) to the block (36). The block is, in turn, mounted upon bottom plate (2), which is fastened into the end of the bore (1), below the annulus (6).

Figure 3:
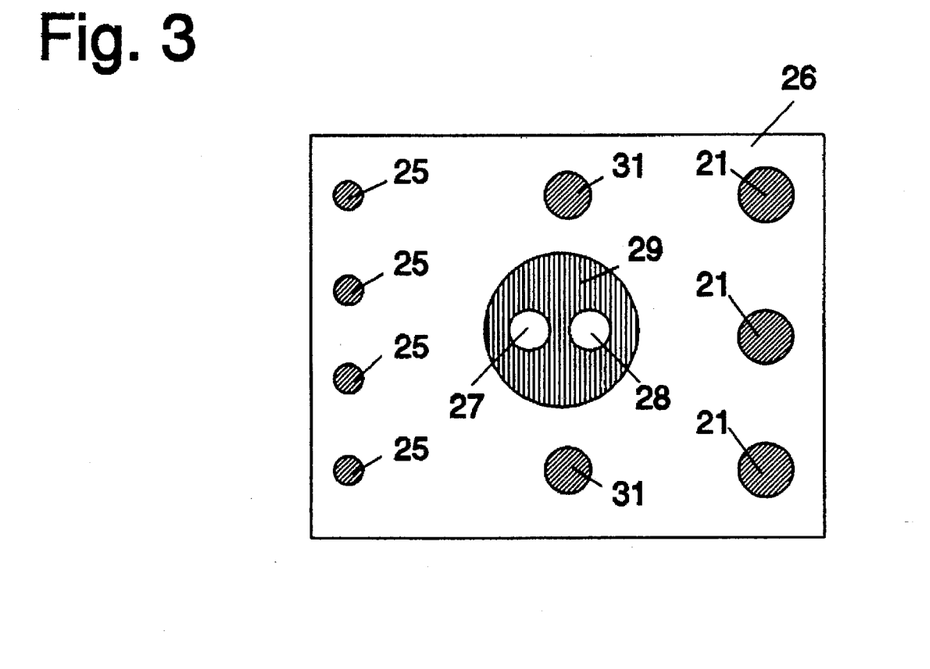
FIG. 3 shows a top view of the plate from FIG. 2 showing the substrate and solder alignment pads.

Total passive alignment of the laser diode (27) relative to the fiber stub (5) is an option in this design detailed in FIGS. 2, 3 and 6.

Referring to these figures, one can see this method in use. Photolithography techniques are used to place precisely located lands (20) (23) on the bottom of the annulus (6), and matching lands (25) (21) on the substrate (29) on which the laser diode (27) is in turn mounted. The monitor photo diode (28) can also be mounted on the substrate (29). These lands are preferably copper, although other materials which have the same solder-wettable properties could be used. Preferably, the diodes are formed onto the substrate in the same fabrication process as the lands, so that precise alignment is maintained, although the lands could be formed subsequent to diode fabrication.

A heat conductive film can be applied to the annulus (6), in order to facilitate heat dissipation from the laser diode. In such a case, plate (26), behind the substrate (29), would also need to be heat conductive. Alternatively, heat dissipating material or fins could be applied to the rear of the plate (26). Preferably, there would be some means (35) for thermally conducting heat from the substrate (29) to the plate (26). This could be copper "wool" or a thermal grease compound as shown in FIGS. 2 and 6.

If desired, the interior (34) of the TOSA could be sealed, in those embodiments using fibers or other solid material for the light conductor through the annulus. This would allow the interior (34) to be filled with a gas such as helium, which has a very high thermal conductivity due to its light molecular weight. Hydrogen gas has an even lower molecular weight, but its flammability would introduce safety concerns in use.

FIG. 3 shows a top view of one embodiment of the substrate (29), showing the progressively size graded lands from the largest ones (21) in the area where the substrate (29) is farthest from the sloped surface of the annulus (6), then smaller (31—not shown in FIG. 2), and smallest (25) on the side closest to the annulus (6). These graded lands are consistent with the embodiment of FIG. 2. As noted elsewhere, this same arrangement of asymmetrical lands would be used in an embodiment as shown in FIGS. 8 and 10 where the annulus or fiber end is not sloped, but where it is desirable to have the substrate itself at an angle to the annulus or fiber end.

Solder joint self-alignment is used to align the plate in the passive alignment embodiments. This method works by placing balls of solder (22) (24) between the lands on the plate (21) (25) and the matching lands on the annulus (20) (23). The solder is then melted, and surface tension on the molten solder (22) (24) draws the plate (26) "floating" on the solder to a centered position. As the solder solidifies, the plate is drawn into alignment without the need for any active alignment.

The angled bottom of the annulus in FIG. 2 could pose problems for the self-alignment process, which are minimized by the varying sizes of the lands as shown in FIG. 3. For simplicity and easier self-alignment, the arrangement of FIG. 6 could be used, in which the annulus (61) is flat on the bottom and only the fiber is angled. In such a case, all of the lands and solder balls could be of the same size.

Figure 8:
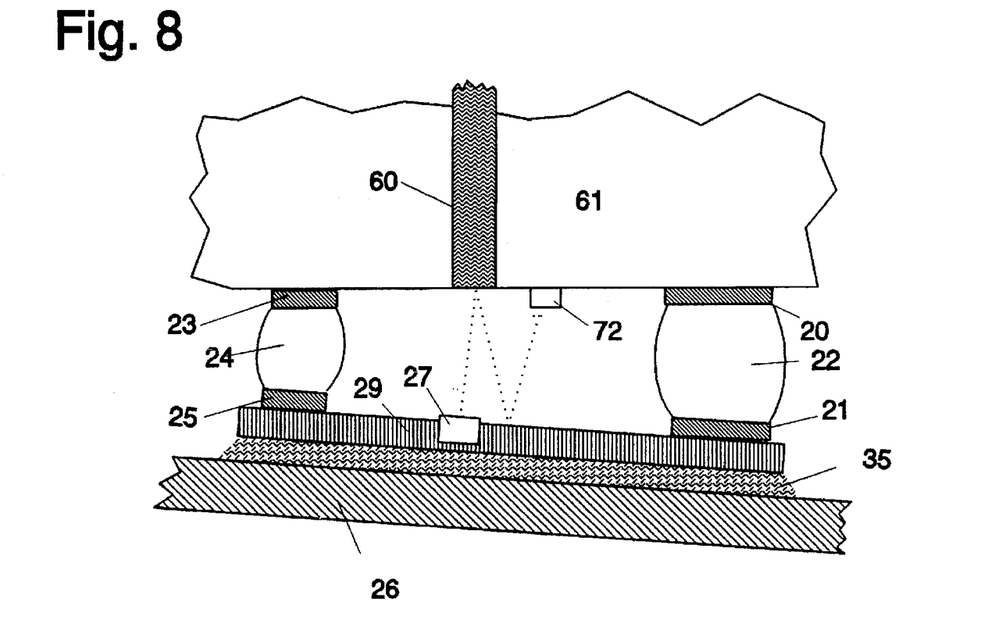
FIG. 8 shows the TOSA of the invention in a "pigtail" embodiment.

FIG. 8 shows another method of slanting the diode (27) relative to the end of the optical fiber (60) using the passive alignment embodiment of the invention. In this method, which might have some advantages in manufacture, the substrate (29) on which the diode (27) is mounted, along with its heat sink (26), is angled relative to the end of the fiber (60), which is perpendicular to the axis of the fiber (i.e. cut straight). In order to accomplish this, the passive alignment lands and solder balls are asymmetrical. That is, the lands (21) on one side of the substrate (21) and their matching lands (20) on the annulus (61) are made larger than the lands (23) (25) on the other side, with a correspondingly larger solder ball. This will passively and automatically align the substrate at a slight angle to the annulus.

It should be noted that the lands and solder balls are also asymmetrical in size in the embodiments shown in FIGS. 2 and 3, where the light source is aligned to the fiber. In that case, the asymmetry of the lands and solder balls counteracts the slant of the annulus to level the substrate relative to the slanted annulus.

It will also be noted in FIG. 8 that the monitor photodiode (72) can be mounted on the annulus (61), measuring light emitted from laser diode (27) which reflects off the conductor and the substrate (29), and possibly off the annulus, one or more times. A reflective layer on the substrate or annulus may be needed to enhance the reflections into the monitor diode. Depending on the beam width of the light source, and the accuracy of the match to the light conductor, some of the light may also affect the monitor diode directly.

This passive alignment method is detailed in a paper entitled, "Statistics of Solder Joint Alignment for Optoelectronic Components", by McGroarty, et al, in IEEE-CHMT 16 (1993), pp.527–529. See also, "Robust interfacing of integrated optics with optical fibres using a self-aligning technique", by Edge, et. Al, *Proceedings of the SPIE—The International Society for Optical Engineering*, 1990, Vol. 1177, pp.374–8

FIG. 9 shows another embodiment of the invention, in which the TOSA is formed directly onto the end of a fiber optic "pigtail", hence this kind of package is sometimes called a "pigtail package", as opposed to the "receptacle" or "plug and socket" TOSAs described above. The pigtail package is a low-cost alternative to the receptacle TOSA.

Referring to FIG. 9, a representative pigtail (90) could be made up of a glass optic core (91) with a diameter of approximately 8 microns, encased in a cladding layer (101) with an outer diameter of approximately 125 microns (also glass), and covered, in turn, in a plastic buffer layer (102) with an outer diameter of perhaps 200–1000 microns. The pigtail ends in an injection molded hermetically sealed body (93) which encloses the components and serves as a mounting. Strain relief (92) is usually provided to protect the fiber. The kind of package shown here, with electrical leads (94) exiting from both sides, is usually called a "butterfly package". If desired, a thermoelectric cooler can be included in the package.

As in the other embodiments of the invention, the inherent mode-field diameter of the laser diode (98) is matched to that of the optical fiber (91). Lands (96) for passive alignment are photolithographically formed on the end of the cable (90), specifically on the cladding layer (101) and, as discussed above, mate with lands on the substrate (99) on which the diode (98) is mounted to allow solder balls (95) to passively align the laser. In order to reduce the cost of the TOSA by eliminating the monitor photodiode, an index of refraction material (100) such as polymethyl methacrylate or oil, is provided between the laser diode (98) and the fiber (91) to minimize RIIN effects.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

We claim:

1. A transmitter optical subassembly for single mode optical fibers, the optical fibers having mode-field diameters, comprising:

a single mode laser diode having an electric power input, and a light output having an inherent mode-field diameter aligned to the single mode optical fiber, such that the light emitted by the single mode laser diode is coupled into the single mode optical fiber;

the inherent mode-field diameter of the single mode laser diode being matched to the mode-field diameter of the single mode optical fiber;

a body having a hollow bore;

an annulus located in the bore, near the lower end thereof;

a single mode light conductor passing entirely through the annulus from its upper surface to its lower surface, aligned with the single mode optical fiber, having a longitudinal axis and having a mode-field diameter related to the mode-field diameter of the single mode optical fiber.

2. The transmitter optical subassembly of claim 1, further comprising means for measuring the light output of the single mode laser diode.

3. The transmitter optical subassembly of claim 2, in which the means for measuring the light output of the single mode laser diode comprises a photo monitor diode mounted adjacent to the single mode laser diode, having a light input oriented such that reflected light is deflected into the light input of the photo monitor diode, and a detector output having a detector signal thereon which is related to the amount of light detected at the light input.

4. The transmitter optical subassembly of claim 3, further comprising means for controlling the electrical input to the single mode laser diode in response to the detector signal on the detector output of the photo monitor diode, such that the output of the single mode laser diode is regulated by the reflected light.

5. The transmitter optical subassembly of claim 1, further comprising a substrate upon which the single mode laser diode is mounted, a plurality of lands on the lower surface of the annulus and a matching plurality of lands on the upper surface of the substrate, the single mode laser diode being mounted on the substrate such that when the lands on the lower surface of the annulus are precisely aligned with the lands on the upper surface of the substrate, the single mode laser diode is precisely aligned with the light conductor in the annulus.

6. The transmitter optical subassembly of claim 5, in which the substrate is passively aligned below the annulus by the provision of molten solder between each of the lands on the annulus and its matching land on the substrate, and the substrate is allowed to self-align as the solder solidifies.

7. The transmitter optical subassembly of claim 6, and the angle between the end of the light conductor and the substrate is established by the provision of differing amounts of solder between the pairs of lands.

8. The transmitter optical subassembly of claim 1, further comprising:

a mounting substrate upon which the single mode laser diode is mounted;

a mounting block, having an upper surface facing the annulus, upon which the substrate is mounted;

spacer means for determining the distance between the annulus and the single mode laser diode, having an upper surface in contact with the lower surface of the annulus and a lower surface in contact with the surface of the mounting block, and a thickness therebetween;

the thickness of the spacer determining the vertical alignment of the single mode laser diode relative to the annulus.

9. The transmitter optical subassembly of claim 8, in which the upper surface of the mounting block upon which the substrate is mounted is angled relative to the optical axis of the single mode light conductor.

10. The transmitter optical subassembly of claim 1 in which the body is sealed and filled with a heat-conductive gas.

11. The transmitter optical subassembly of claim 10 in which the gas is Helium.

12. The transmitter optical subassembly of claim 1 in which the laser diode is a surface-emitting laser diode.

13. The transmitter optical subassembly of claim 1 in which the lower surface of the annulus forms an angle to the longitudinal axis of the single mode light conductor in the annulus.

14. The transmitter optical subassembly of claim 1 in which the surface of the end of the single mode light conductor in the annulus at the lower surface of the annulus forms an angle to the longitudinal axis of the single mode light conductor in the annulus.

15. The transmitter optical subassembly of claim 1 in which the light conductor in the annulus is a single mode optical fiber stub with an upper end at the upper surface of the annulus.

16. The transmitter optical subassembly of claim 1 in which the light conductor in the annulus is the single mode optical fiber.

17. The transmitter optical subassembly of claim 1 in which the light conductor in the annulus is a tube having a reflective inner surface.

18. A transmitter optical subassembly for single mode optical fibers, the optical fibers having mode-field diameters, comprising:

a single mode laser diode having an electric power input, and a light output having an inherent mode-field diameter aligned to the single mode optical fiber, such that the light emitted by the single mode laser diode is coupled into the single mode optical fiber;

the inherent mode-field diameter of the single mode laser diode being matched to the mode-field diameter of the single mode optical fiber;

index of refraction matching material between the light output of the single mode laser diode and the single mode optical fiber, the index of refraction matching material being a fluid.

19. The transmitter optical subassembly of claim 18 in which the fluid is oil.

20. A transmitter optical subassembly for single mode optical fibers, the optical fibers having mode-field diameters, comprising:

a single mode laser diode having an electric power input, and a light output having an inherent mode-field diameter aligned to the single mode optical fiber, such that the light emitted by the single mode laser diode is coupled into the single mode optical fiber;

the inherent mode-field diameter of the single mode laser diode being matched to the mode-field diameter of the single mode optical fiber;

index of refraction matching material between the light output of the single mode laser diode and the single mode optical fiber, the index of refraction matching material being a substance which is initially deformable.

21. A transmitter optical subassembly for single mode optical fibers, the optical fibers having mode-field diameters, comprising:

a single mode laser diode having an electric power input, and a light output having an inherent mode-field diameter aligned to the single mode optical fiber, such that the light emitted by the single mode laser diode is coupled into the single mode optical fiber;

the inherent mode-field diameter of the single mode laser diode being matched to the mode-field diameter of the single mode optical fiber;

a substrate upon which the single mode laser diode is mounted, a plurality of lands on the end of the single mode optical fiber, and a matching plurality of lands on the upper surface of the substrate, the single mode laser diode being mounted on the substrate such that when the lands on the end of the single mode optical fiber are precisely aligned with the lands on the upper surface of the substrate, the single mode laser diode is precisely aligned with the single mode optical fiber.

22. The transmitter optical subassembly of claim 21 further comprising index of refraction matching material between the light output of the single mode laser diode and the single mode optical fiber.

23. The transmitter optical subassembly of claim 22 in which the index of refraction matching material is a fluid.

24. The transmitter optical subassembly of claim 23 in which the fluid is oil.

25. The transmitter optical subassembly of claim 22 in which the index of refraction matching material is a substance which is initially deformable.

26. The transmitter optical subassembly of claim 21, further comprising means for measuring the light output of the single mode laser diode.

27. The transmitter optical subassembly of claim 26, in which the means for measuring the light output of the single mode laser diode comprises a photo monitor diode mounted adjacent to the single mode laser diode, having a light input oriented such that reflected light is deflected into the light input of the photo monitor diode, and a detector output having a detector signal thereon which is related to the amount of light detected at the light input.

28. The transmitter optical subassembly of claim 27, further comprising means for controlling the electrical input to the single mode laser diode in response to the detector signal on the detector output of the photo monitor diode, such that the output of the single mode laser diode is regulated by the reflected light.

29. The transmitter optical subassembly of claim 21, in which the substrate is passively aligned to the end of the single mode optical fiber by the provision of molten solder between each of the lands on the end of the single mode optical fiber and its matching land on the substrate, and the substrate is allowed to self-align as the solder solidifies.

30. The transmitter optical subassembly of claim 29, in which the substrate is passively aligned to the end of the single mode optical fiber by the provision of molten solder between each of the lands on the end of the single mode optical fiber and its matching land on the substrate, and the substrate is allowed to self-align as the solder solidifies, and the angle between the end of the single mode optical fiber and the substrate is established by the provision of differing amounts of solder between the pairs of lands.

31. The transmitter optical subassembly of claim 21 in which the upper surface of the substrate is at an angle to the end of the single mode optical fiber.

32. The transmitter optical subassembly of claim 21, further comprising a body encapsulating the single mode laser diode and the end of the single mode optical fiber.

* * * * *